US006821906B2

(12) United States Patent
Wada et al.

(10) Patent No.: US 6,821,906 B2
(45) Date of Patent: Nov. 23, 2004

(54) METHOD AND APPARATUS FOR TREATING SURFACE OF SUBSTRATE PLATE

(75) Inventors: Kenya Wada, Naka-gun (JP); Kazuto Kinoshita, Naka-gun (JP); Kazuhiko Gommori, Naka-gun (JP)

(73) Assignee: Hitachi High-Tech Electronics Engineering Co., Ltd., Tokyo (JP)

(*) Notice: Subject to any disclaimer, the term of this patent is extended or adjusted under 35 U.S.C. 154(b) by 104 days.

(21) Appl. No.: 09/988,559

(22) Filed: Nov. 20, 2001

(65) Prior Publication Data

US 2002/0192391 A1 Dec. 19, 2002

(30) Foreign Application Priority Data

Jun. 18, 2001 (JP) ....................................... 2001-182679

(51) Int. Cl.[7] .......................... H01L 21/00; H05H 1/00; C23C 16/00

(52) U.S. Cl. .................... 438/708; 438/709; 156/345.5; 156/345.54; 118/722; 118/718

(58) Field of Search ......................... 156/345.5, 345.54, 156/345.51; 118/722, 718, 729, 733; 438/706–708, 745–748

(56) References Cited

U.S. PATENT DOCUMENTS 4,188,199 A * 2/1980 Van Laethem et al. ...... 65/60.4
5,520,740 A * 5/1996 Kanai et al. ................ 118/718

FOREIGN PATENT DOCUMENTS

JP 2001137800 A * 5/2001 ............. B08B/7/00

* cited by examiner

*Primary Examiner*—Parviz Hassanzadeh
(74) *Attorney, Agent, or Firm*—Keady, Olds & Maier, PLLC

(57) ABSTRACT

Method and apparatus for treating a surface of a substrate plate under irradiation of ultraviolet ray emitted from a dielectric barrier discharge lamp. Upon admission into a treating chamber, oxygen is removed from a treating surface and surrounding atmosphere of a substrate plate in order to suppress energy losses of ultraviolet ray to a minimum.

5 Claims, 9 Drawing Sheets

METHOD AND APPARATUS FOR TREATING SURFACE OF SUBSTRATE PLATE

BACKGROUND OF THE INVENTION

1. Field of the Art

This invention relates to a method and an apparatus for treating surfaces of substrate plates such as of liquid crystal display panels, semiconductor wafers, magnetic disks, optical disks and so forth, and more particularly to a method and an apparatus for washing or etching surfaces of substrate plates of glass, semiconductor, synthetic resin, ceramics, metal or composite material of these substances under irradiation of ultraviolet ray.

2. Prior Art

For instance, in the case of a TFT substrate which constitutes a transparent substrate of a liquid crystal display panel, circuit patterns including transparent electrodes are formed on its surface by the use of film forming means. In the course of an LCD panel fabrication process, surfaces of LCD panel substrate plates are processed through washing and etching treatments. In treating substrate plates of this sort, it has been the general practice to resort to the so-called wet process in which a treating liquid is applied or sprayed on the surface of each substrate plate. However, recently a dry process by irradiation of ultraviolet ray is increasingly employed for the washing and etching treatments of various substrate plates.

In this regard, disclosed in Japanese Laid-Open Patent Application 2001-137800 is a process for treating substrate plates under irradiation of ultraviolet ray. In this prior art process, while being transferred on a conveyer means, substrate plates to be treated are passed through a lower portion of a lamp house which is internally provided with a dielectric barrier discharge lamp and supplied with a moistened inert gas, i.e., a mixture of water vapor and an inert gas. The energy of irradiated ultraviolet ray from the dielectric barrier discharge lamp act on organic contaminants which have deposited on the surface of a substrate plate, breaking up chemical bonds in organic contaminants and decomposing same into substances of low molecular weight. In addition, the ultraviolet ray also act on water vapor in the atmosphere and decompose water to produce a reducing active member [H.] and an oxidative active member [.OH]. As a consequence, the low molecular weight substances which exist on the substrate surface are converted into volatile substances through reduction or oxidation, by reactions with the reductive and oxidative members [H.] and [.OH], and released from the substrate surface. Thus, the substrate surface is cleaned and at the same time improved in wettability.

In this connection, if oxygen exists in the atmosphere in which a substrate plate is irradiated with ultraviolet ray from a dielectric barrier discharge lamp, the energy of ultraviolet light ray is absorbed and attenuated by oxygen. As a result, the capacity of decomposing organic contaminants on the substrate surface is impaired to a considerable degree. Therefore, it is extremely important to control the atmosphere of ultraviolet irradiation, more specifically, to provide a dielectric barrier discharge lamp within a treating chamber which is arranged to exclude oxygen from the atmosphere within the chamber as much as possible. A mixture gas consisting of water vapor and an inert gas and is supplied to the treating chamber as mentioned above, for the purpose of generating the necessary active members [H.] and [.OH] on and in the vicinity of a substrate plate in a concentrated manner. Further, the internal pressure of the treating chamber needs to be maintained at an elevated level in order to shield from air entrance and exit openings which are provided at the upstream and downstream ends of the treating chamber.

Thus, it is an utmost importance to maintain, within a treating chamber, a moistened inert gas atmosphere which is free of oxygen, in order to effectively generate the above-mentioned active members, which contribute the decomposition of organic contaminants on the surfaces of a substrate plate under irradiation of ultraviolet ray from a dielectric barrier discharge lamp, and to carry out a washing or other treatment to an extremely high accuracy. In this regard, the above-mentioned prior art has a problem as explained below.

Namely, as a substrate plate is transferred into a treating chamber from outside, air is inevitably admitted into the treating chamber along with the substrate plate. Especially, due to its viscosity, an air layer which exists on the surface of the substrate plate remains stuck on the substrate surface even after admission into the treating chamber. Therefore, if the substrate plate in this state is advanced to an irradiating position under a dielectric barrier discharge lamp in the treating chamber, considerable energy losses are caused by the air layer which absorbs the energy of ultraviolet ray, even in a case where the atmosphere in the treating chamber is strictly controlled.

SUMMARY OF THE INVENTION

With the foregoing situations in view, it is an object of the present invention to provide a method and an apparatus for treating a surface of a substrate plate under irradiation of ultraviolet ray emitted from a dielectric barrier discharge lamp, suppressing energy loss of ultraviolet ray to a minimum by removing oxygen from or in the vicinity of a treating surface of the substrate plate prior to irradiation of ultraviolet ray from the dielectric barrier discharge lamp.

According to the present invention, the above-stated objective is achieved by the provision of a method for treating a surface of a substrate plate under irradiation of ultraviolet ray emitted from a dielectric barrier discharge lamp, which comprises the steps of: removing oxygen on and in the vicinity of a treating surface of the substrate plate; supplying humidified inert gas toward the substrate plate to humidify the treating surface and surrounding atmosphere of the substrate plate; and irradiating the treating surface of the substrate plate with ultraviolet ray from the dielectric barrier discharge lamp.

According to a preferred form of the present invention, there is provided a method for treating a surface of a substrate plate while being transferred horizontally across a treating chamber under irradiation of ultraviolet ray emitted from a dielectric barrier discharge lamp, which comprises the steps of: removing oxygen or air on and in the vicinity of a treating surface of the substrate plate by blasting a sweeping inert gas thereto from a direction opposite to substrate transfer direction; supplying a water vapor-containing humidified inert gas obliquely toward the substrate plate in a forward direction in the substrate transfer direction to humidify the treating surface and surrounding atmosphere of the substrate plate; and irradiating the treating surface of the substrate plate with ultraviolet ray from the dielectric barrier discharge lamp thereby cracking water vapor into a reductive active member [H.] and an oxidative active member [.OH] for reaction with contaminant substances on the treating surface.

According to the present invention, there is also provided an apparatus for treating a surface of a substrate plate under irradiation of ultraviolet ray, comprising: a treating chamber provided in part of a path along which a substrate plate is transferred horizontally by a conveyer means, the treating chamber being provided with a dielectric barrier discharge lamp for irradiating ultraviolet ray on a treating surface of the substrate plate; a humidified inert gas feed means located at a position upstream of an irradiating region of the dielectric barrier discharge lamp in substrate transfer direction thereby to supply a humidified inert gas toward the treating surface of the substrate plate; and an oxygen removing means located at a position upstream of the humidified inert gas feed means in the substrate transfer direction for removing oxygen from the treating surface and surrounding atmosphere of the substrate plate.

The above and other objects, features and advantages of the present invention will become apparent from the following particular description of the invention, taken in conjunction with the accompanying drawings which show by way of example some preferred embodiments of the invention. Needless to say, the present invention is not limited to particular forms shown in the drawings.

DESCRIPTION OF PREFERRED EMBODIMENTS

Figure 1:
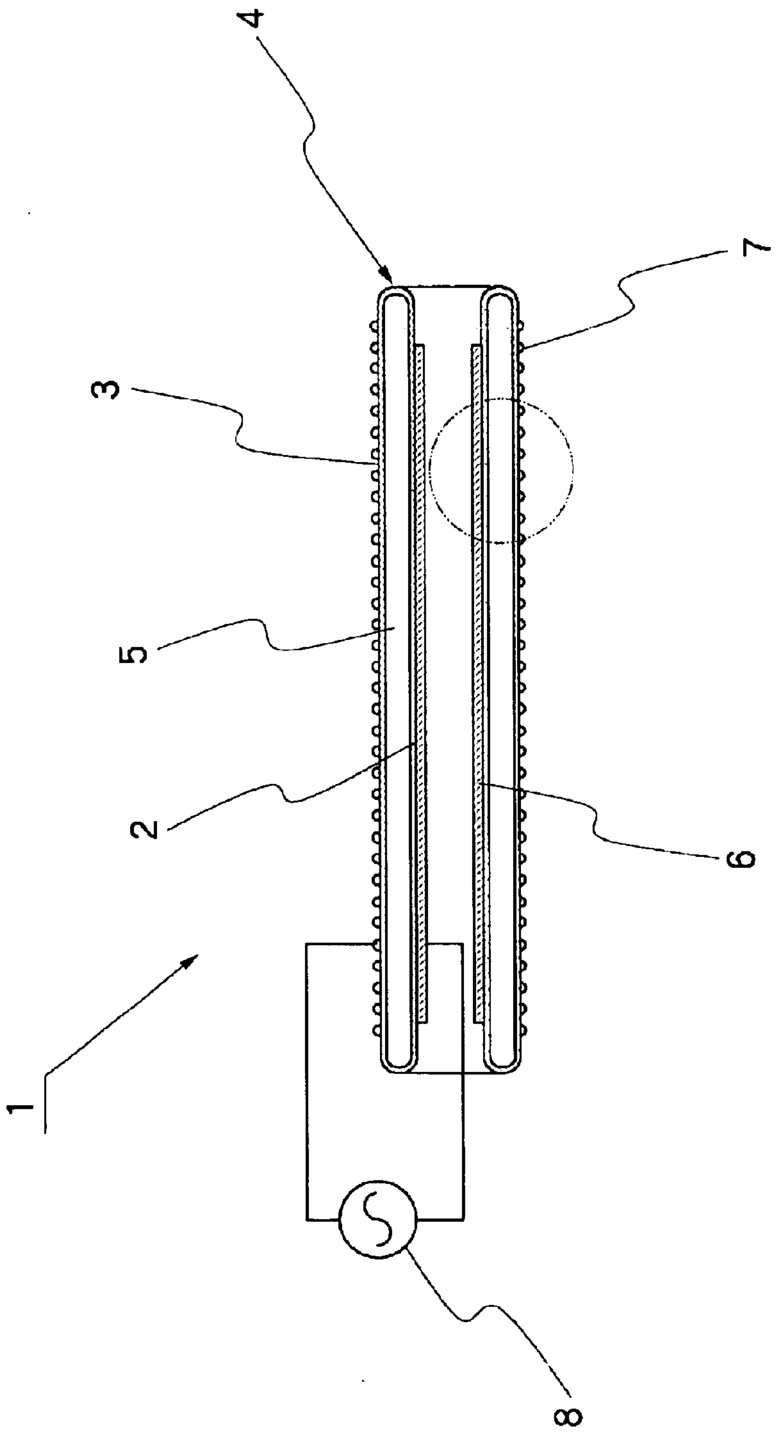
FIG. 1 is a schematic view of a dielectric barrier discharge lamp used in a substrate treating apparatus according to the present invention.
Figure 2:
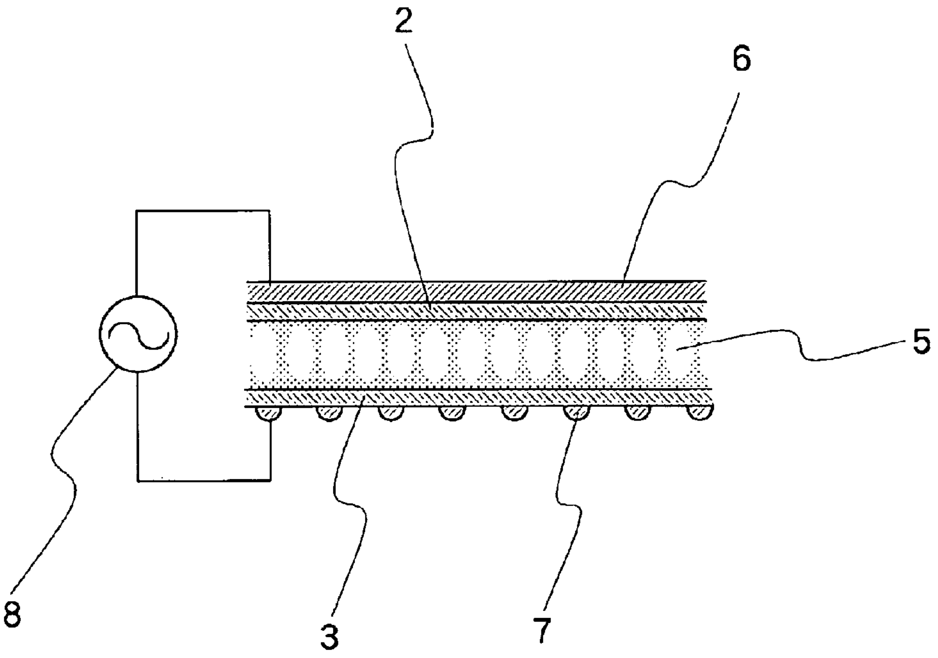
FIG. 2 is an enlarged fragmentary view of the dielectric barrier discharge lamp shown in FIG. 1.

Hereafter, the present invention is described more particularly by way of its preferred embodiments shown in the drawings. Firstly, schematically shown in FIGS. 1 and 2 is a dielectric barrier discharge lamp assembly (hereinafter referred to simply as 'discharge lamp' for brevity) which is employed on a substrate processing apparatus according to the present invention.

In these figures, indicated at 1 is the discharge lamp. The discharge lamp 1 is constituted by a quartz glass tube 4 of an annular shape, having inner and outer tubes 2 and 3, which are both formed of quartz glass and integrally with each other. Provided internally of the quartz glass tube 4 is a hermetically closed discharge space 5. Securely fixed to the inner side of the inner tube 2 is a metal electrode 6 consisting of a cylindrical metal sheet. On the other hand, provided on the outer periphery of the outer tube 3 is a metal mesh electrode 7. An ac power source 8 is connected between the metal electrode 6 and metal mesh electrode 7. Further, a passage for a coolant fluid (e.g. cooling water) is provided on the inner side of the inner tube 2 for cooling the metal electrode 6.

A discharge gas is sealed in the quartz glass tube 4, so that, upon applying an ac high voltage between the metal electrode 6 and the metal mesh electrode 7, discharge plasma (dielectric barrier discharge) occurs across a dielectric between the inner and outer tubes 2 and 3, and, by this discharge plasma, atoms of the discharge gas are excited into a plasma discharge state. Plasma discharge emission takes place as the discharge gas atoms in the plasma state return to a normal state. At this time, the emission spectrum varies depending upon the nature of the discharge gas which is sealed in the quartz glass tube 4. In the case of a xenon gas (Xe), for example, monochrome light having a center wavelength at 172 nm is emitted. The metal electrode 6 functions as a reflector plate, while the metal mesh electrode 7 functions substantially as a transparent electrode. Therefore, ultraviolet light of short wavelength is irradiated from the side of the outer tube 3. In this instance, for example, the pressure of charged xenon gas is approximately 350 torr.

Figure 3:
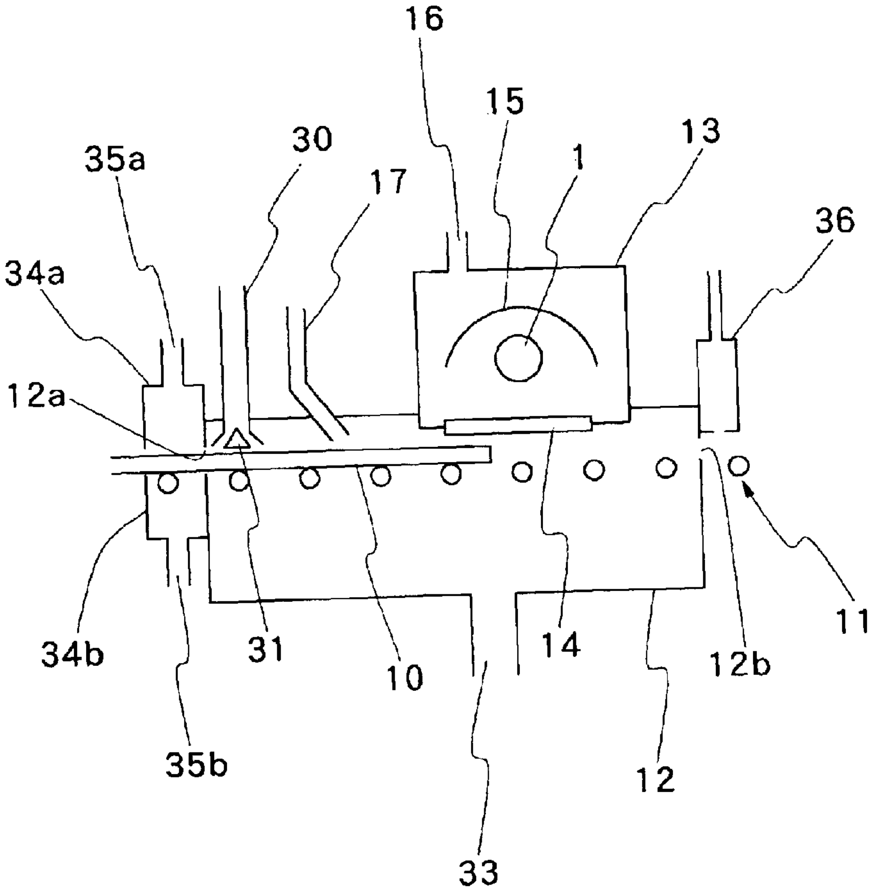
FIG. 3 is a schematic view of a substrate treating apparatus adopted as a first embodiment of the present invention.

Schematically illustrated in FIG. 3 is an apparatus for dry-washing transparent substrates of LCD panels by the use of the discharge lamp 1 as described above. In this figure, indicated at 10 is a substrate plate under a dry-washing treatment. For example, the substrate 10 consists of a thin plate of glass, semiconductor, synthetic resin, ceramics, metal and so forth, and of a rectangular or circular shape in plan view. The substrate 10 is supported on a transfer means, for example, on a roller conveyer 11 (e.g., consisting of a plural number of rollers on rotational shafts which are arranged in a predetermined pitch in the direction of transfer), and thereby transferred in the direction indicated by an arrow in the same figure while receiving a dry-washing treatment on its surface or surfaces. For this purpose, a treating chamber 12 of the washing apparatus is located in a predetermined position in the path of transfer by the roller conveyer 11. The treating chamber 12 is provided with an entrance opening 12*a* and an exit opening 12*b* in its walls at its upstream and downstream ends for admitting untreated substrate plates 10 and for sending out treated substrate plates 10 therethrough, respectively. The entrance and exit openings 12*a* and 12*b* are arranged to have a minimum open area which permits at least passage of the substrate plates 10 and which can keep the substrate plates 10 out of contact with walls of the entrance and exit openings 12*a* and 12*b* even if the substrates 10 are vibrated while being transferred by the conveyer 11.

Provided on top of the treating chamber 12 is a lamp house 13 having the discharge lamp 1 installed therein. The lamp house 12 is arranged to internally provide a hermetically closed space, and a window pane 14 made of quartz glass is fitted on the bottom side of the lamp house 13 under the discharge lamp 1. Further, a reflector member 15 in the form of a concave mirror or the like is provided over the discharge lamp 1, so that ultraviolet ray from the discharge lamp 1 is reflected in downward directions. A nitrogen gas feed pipe 16 is connected to the lamp house 13 for the purpose of preventing attenuation of ultraviolet ray from the discharge lamp 1. More specifically, through the nitrogen gas feed pipe 16, nitrogen gas ($N_2$ gas) is fed into the lamp house 13 as an inert gas to provide an oxygen-free space therein. In this instance, the nitrogen gas is dry nitrogen gas or wet nitrogen gas containing water vapor.

Further, wet nitrogen gas, which is moistened with water vapor, is also supplied as an inert gas medium toward a treating surface of the substrate plate 10. For this purpose, a wet nitrogen gas feed nozzle 17 is opened into the treating chamber 12. This wet nitrogen gas feed nozzle 17 is located on an upstream side of the lamp house 13 in the transfer direction of the substrate plate 10, and is at least of a width which is sufficient for covering the entire width of the substrate plate 10. In order to spurt the wet nitrogen gas toward the substrate plate 10 obliquely from above, a lower end portion of the wet nitrogen gas feed nozzle 17 is angularly bent through a predetermined angle.

Figure 4:
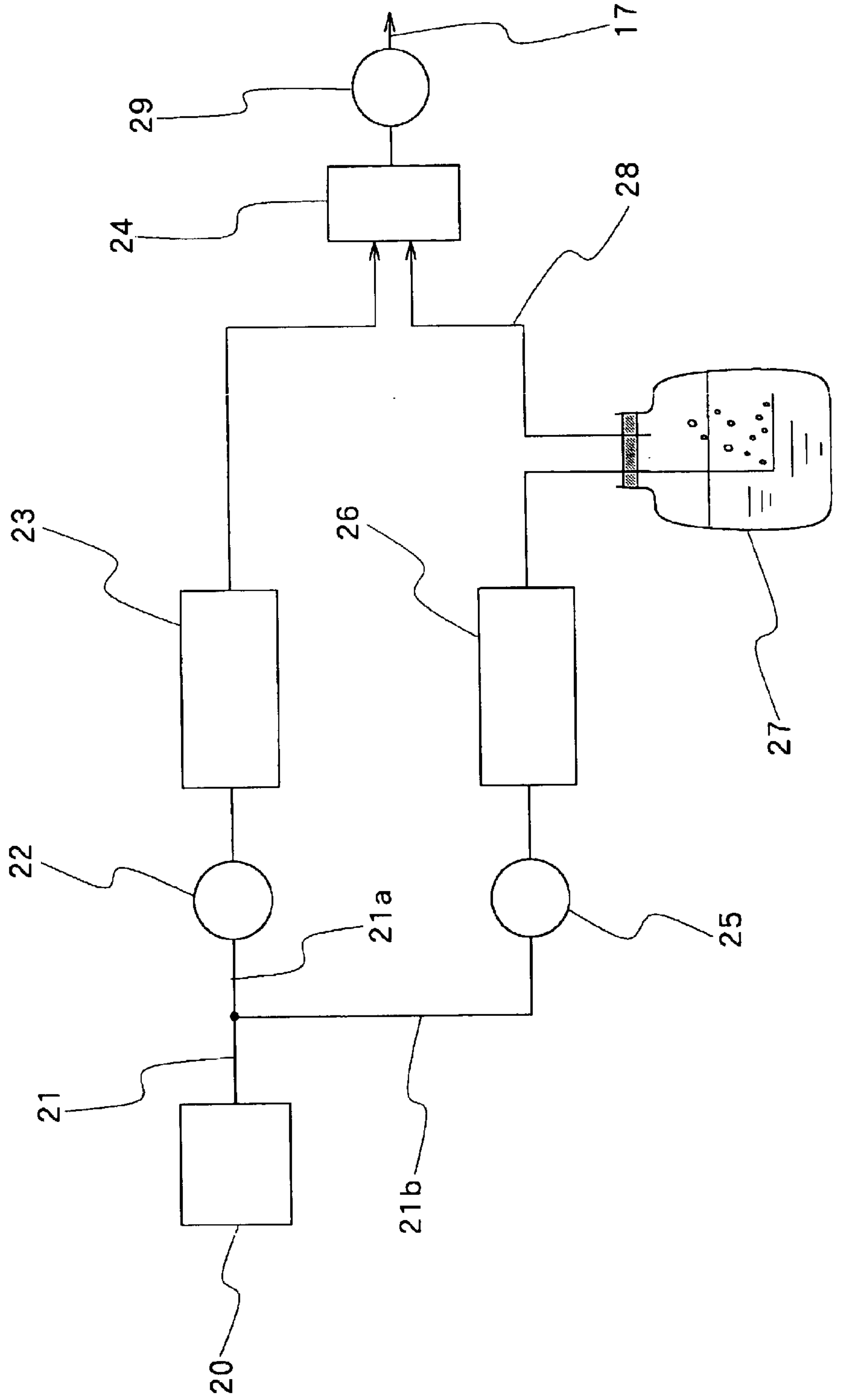
FIG. 4 is a diagrammatic illustration of a nitrogen gas moisturizer.

In this instance, wet nitrogen gas which is moistened with water vapor is supplied through the wet nitrogen gas feed nozzle 17. For this purpose, the wet nitrogen gas feed nozzle 17 is connected to a nitrogen gas humidifier. Shown in FIG. 4 is an example of a nitrogen gas humidifier construction which can serve for the purpose of the present invention. In this figure, indicated at 20 is a nitrogen gas tank which is a source of nitrogen gas. A wet nitrogen gas feed pipe 21 from the tank 20 is bifurcated into two branch pipes 21*a* and 21*b*. A first branch pipe 21*a* is connected to a mixer 24 through a flow regulator valve 22 and a flow meter 23.

On the other hand, a second branch pipe 21*b* is connected to and opened into a pure water tank 27 at a submerged position, through a flow regulator valve 25 and a flow meter 26. The submerged portion of the second branch pipe 21*b* is provided with a multitude of fine pores for releasing nitrogen gas into pure water of the tank 27. As bubbles of nitrogen gas climb up toward the surface of pure water in the tank 27, water vapor is generated to produce moistened nitrogen gas, that is, a humidified neutral gas. The moistened nitrogen gas thus produced is led into the mixer 24 and mixed with nitrogen gas from the first branch pipe 21*a* to adjust the moisture concentration in the inert gas. The above-mentioned nitrogen gas feed nozzle 17 which is projected into the chamber 12 is connected from the mixer 24, and provided with a pressure regulator valve 29 thereby to adjust the pressure of humidified nitrogen gas to be supplied to the chamber 12.

Figure 5:
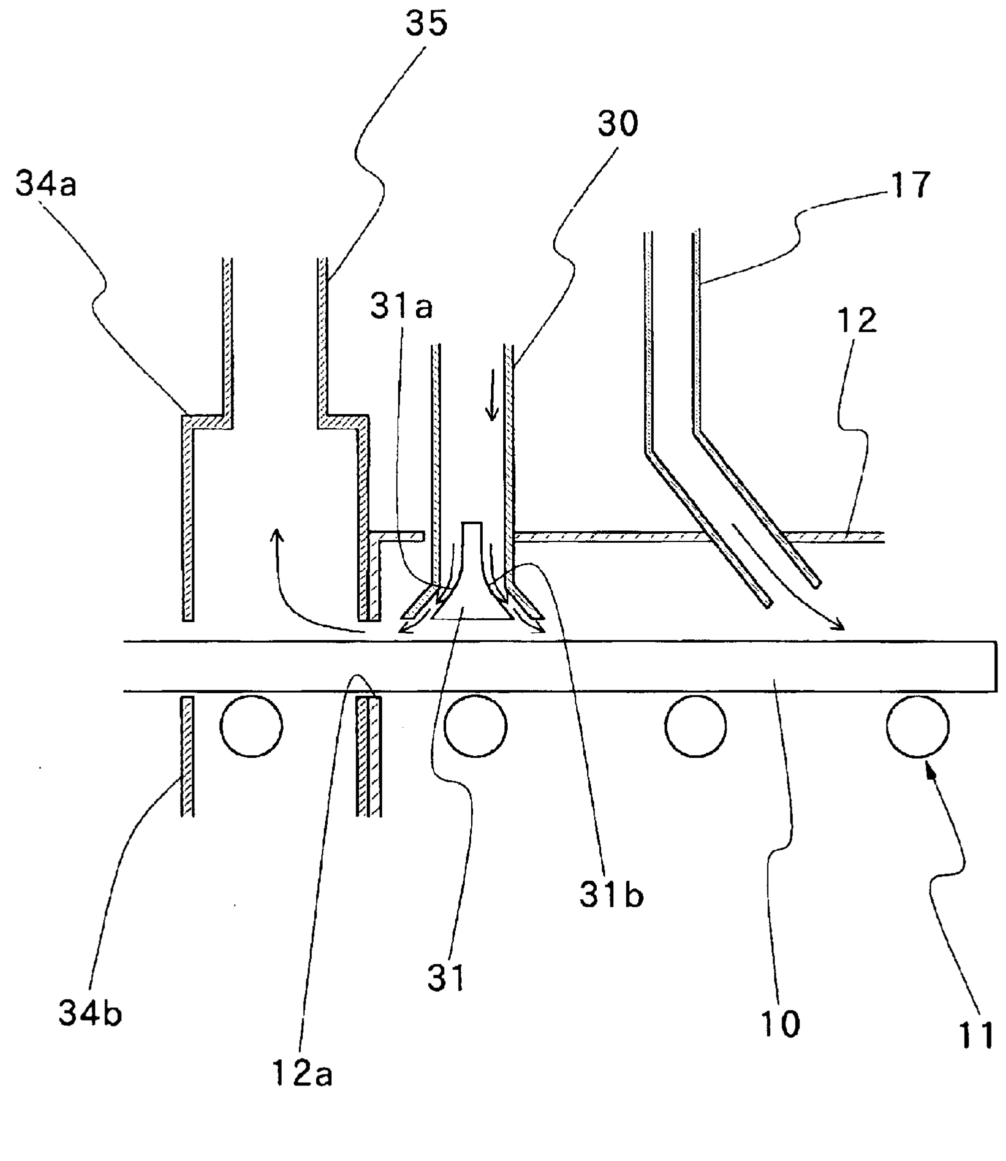
FIG. 5 is a fragmentary sectional view of the substrate treating apparatus shown in FIG. 3.

As an oxygen removing means, a nitrogen gas nozzle 30 is projected into the treating chamber at a position on the upstream side of the position of the wet nitrogen gas feed nozzle 17 in the transfer direction of the substrate plate 10. More specifically, the nitrogen gas injection nozzle 30 is located between the wet nitrogen gas feed nozzle 17 and the entrance opening 12*a* of the treating chamber 12, and provided with a spout mouth, which is of a sufficient length for covering the entire width of the substrate plate 10 and adapted to spurt nitrogen gas immediately downward toward the substrate plate 10. Front and rear lips of the spout mouth of the nitrogen gas injection nozzle 30 are diverged or spread apart in forward and rearward directions, a gas distribution guide member 31 is provided between the front and rear lips of the nozzle mouth. As indicated by arrows in FIG. 5, the dry nitrogen gas which flows through the nitrogen gas injection nozzle 30 is divided by the gas distribution guide member 31 into two separate streams, one stream being guided in the rearward direction toward the entrance opening 12*a* of the treating chamber 12 to fall on an incoming substrate plate portion obliquely from above. The other streams of nitrogen gas are guided forward in the transfer direction of the substrate plate 10. For guiding streams of dry nitrogen gas in two different directions in this manner, the gas distribution guide member 31 is provided with inclined guide surfaces 31*a* and 31*b* which diverge away from each other in the downward direction.

Further, an exhaust pipe 33 is connected to a bottom portion of the treating chamber 12 at a position under and at a downstream side of the lamp house 13. The other end of the exhaust pipe 33 is connected to a suction pump or a negative pressure generating means so that a negative pressure or suction force prevails in the exhaust pipe 33. Therefore, the gases which are supplied into the treating chamber 12 through the nitrogen gas injection nozzle 30 and the wet nitrogen gas feed nozzle 17 are constantly urged to flow out through the exhaust pipe 33 without lingering in the treating chamber 12. Namely, the gases are constantly circulated through the treating chamber 12.

Intrusion of air from outside can be prevented by elevating the internal pressure of the treating chamber 12 above the atmospheric pressure. However, in order to blocking intrusion of air in a more assured manner, upper and lower suction boxes 34*a* and 34*b* are provided opposingly on the outer side of the entrance openings 12*a* of the treating chamber 12 as an air shielding means. The upper and lower suction boxes 34*a* and 34*b* are connected to suction pipes 35*a* and 35*b*, respectively, and spaced apart from each other by a gap space which permits passage of the substrate plate 10. On the other hand, an air curtain box 36 is provided on the outer side of the exit opening 12*b* of the treating chamber 12 to serve as an air shield means for generating downward air streams constantly along outer surfaces of the treating chamber 12 and thereby forming an air shield across the exit opening 12*b*. The shielding air streams are blocked by the substrate plate 10 while the latter is being passed through the exit opening 12*b*. However, on that occasion, the exit opening 12*b* is substantially closed by the substrate plate 10 which is moving in the outward direction, so that intrusion of air from outside can be prevented securely as long as the internal pressure of the treating chamber 12 is maintained at a slightly elevated level as compared with the atmospheric or ambient pressure.

Thus, by supply of dry nitrogen gas to the lamp house 13 with the discharge lamp 1 through the nitrogen gas feed pipe 16, an oxygen-free atmosphere is created within the closed internal space of the lamp house 13. In the meantime, through the nitrogen gas injection nozzle 30, dry nitrogen gas is also injected into the treating chamber 12, in which a substantially oxygen-free and nitrogen gas-prevailing atmosphere is maintained because the entrance and exit openings 12*a* and 12*b* are shielded by the air shielding suction boxes 34*a* and 34*b* and the air curtain box 36, respectively, to prevent intrusion of air. Besides, the wet nitrogen gas feed nozzle 17 is also located in the treating chamber 12. Water vapor in the wet nitrogen gas which is supplied through the wet nitrogen gas feed nozzle 17 should not be allowed to prevail in the treating chamber 12. For this purpose, it is preferred to turn off injection of wet nitrogen gas through the nozzle 17 when no substrate plate 10 exists within the treating chamber 12. However, in a case where the exhaust pipe 33 is opened in a vertically confronting position with respect to the wet nitrogen gas feed nozzle 17, wet nitrogen gas is almost immediately discharged through the exhaust pipe 33 instead of dwelling in the treating chamber 12 even if it is injected continuously.

Through the entrance opening 12*a*, the substrate plate 10 on the roller conveyer 11 is admitted into the atmosphere within the treating chamber 12 which is controlled in the manner as described above. Atmospheric air prevails outside the treating chamber 12. Therefore, upon admission into the treating chamber 12, air still exists on or in the vicinity of surfaces of the substrate plate 10 and, due to its viscosity, tends to remain stuck on substrate surfaces even after the substrate plate 10 has been admitted into the treating chamber 12. Therefore, air which exists on or in the vicinity of substrate surfaces needs to be replaced by nitrogen gas, in an initial oxygen removing stage as described below.

Namely, as soon as the substrate plate 10 is admitted into the treating chamber 12 through the entrance opening 12*a*, dry nitrogen gas is sprayed on a treating surface of the substrate plate 10 from the nitrogen gas injection nozzle 30. After being switched in flow direction and rectified by the guide surface 31*a* of the gas distribution guide member 31, dry nitrogen gas is sprayed on the treating surface of the substrate plate 10 obliquely from above and allowed to flow along the treating surface of the substrate plate 10. Because of the suction force of the air shielding suction boxes 34*a* which is provided on the outer side of the entrance opening 12*a*, the velocity of the dry nitrogen gas flow on and along the treating plate 10 is increased to such a degree as to scrape off an air layer which has remained on the surface of the substrate plate 10 since admission into the treating chamber 12, pushing away air through the entrance opening 12*a*. As a consequence, air on the treating surface of the substrate plate 10 is removed and replaced by dry nitrogen gas which is free of oxygen.

Further to the replacement of air, wet nitrogen gas which is injected through the wet nitrogen gas feed nozzle 17 is supplied toward the substrate plate 10 to wet the treating surface as well as the atmosphere in the vicinity of the substrate plate 10. In this humidifying stage, wet nitrogen gas is injected forward in the transfer direction of the substrate plate 10 and showered on the latter obliquely from above. Consequently, wet nitrogen gas is supplied to the treating surface of the substrate plate 10 which is now free of oxygen, as a result of replacement by nitrogen gas in the preceding stage. Thus, the treating surface of the substrate plate 10 is held in an oxygen-free atmosphere consisting of a mixture of an inert gas and water vapor.

Further, as the substrate plate 10 is advanced to a position under the window 14 of the lamp house 13, the treating surface of the substrate 10 is irradiated with short wavelength ultraviolet ray from the discharge lamp 1 for a washing treatment. This is a treating stage. At this time, in order to suppress attenuation of ultraviolet ray from the discharge lamp 1 as much as possible, it is preferred to narrow the gap space between the treating surface of the substrate plate 10 and the glass 10 of the irradiation window to a minimal value. Nevertheless, it is necessary to keep the treating surface of the substrate plate 10 out of contact with the window pane 14 while it is transferred by the roller conveyer 11. Considering that the substrate plate 10 is inevitably vibrated to a certain degree while being transferred on the conveyer 11, the substrate plate 10 should be spaced from the window pane 14 by a minimum gap space which will be necessary to keep the substrate plate 10 out of contact with the window pane 14 despite its vibrations.

Due to the existence of a mixed fluid of nitrogen gas and water on and in the vicinity of the treating surface of the substrate plate 10, water is cracked under irradiation of ultraviolet light from the discharge lamp 1 into a reductive active member [H.] and an oxidative active member [.OH]. Besides, under irradiation of short wavelength ultraviolet light, organic contaminants which have deposited on the surface of the substrata 10 are decomposed into products of lower molecular weights. Further, the low molecular weight products resulting from the decomposition of organic contaminants are subjected to reducing and oxidative reactions with the cracked active members of water. More specifically, not only oxidative reactions with the oxidative active member [.OH] but also reducing reactions with reductive active member [H.] take place on or in the vicinity of the surface of the substrate 10 to convert decomposed organic substances into volatile substances quickly in an assured manner.

In addition, the gas distribution guide member 31 of the nitrogen gas injecting nozzle 30 is provided with the guide surface 31*b* which is arranged to direct nitrogen gas forward in the substrate transfer direction, while the wet gas feed nozzle 17 is arranged to form wet nitrogen gas streams also in the substrate transfer direction. Therefore, volatile substances which are generated under irradiation of ultraviolet ray are drifted away from the irradiating region under the lamp house 13 and urged to leave the treating chamber quickly through the exhaust pipe 33. Accordingly, wet nitrogen gas containing water vapor is constantly supplied to the irradiating region under the lamp house 13.

By the dry washing treatment as described above, organic contaminants are removed from the surface of the substrate 10. In addition, the substrate surface becomes to have a smaller contact angle as a result of irradiation of short wavelength ultraviolet ray in the presence of water vapor. A substrate surface with a smaller contact angle shows improved wettability in a subsequent wet washing treatment, for example, in a shower washing treatment, making it possible to wash away organic contaminants more readily and completely from its surfaces. Accordingly, the substrate 10 can be washed into an extremely clean state. For instance, the above-described dry-washing treatment may be carried out for the purpose of improving surface conditions of substrates in a stage preparatory to application of a liquid developer or the like.

Figure 6:
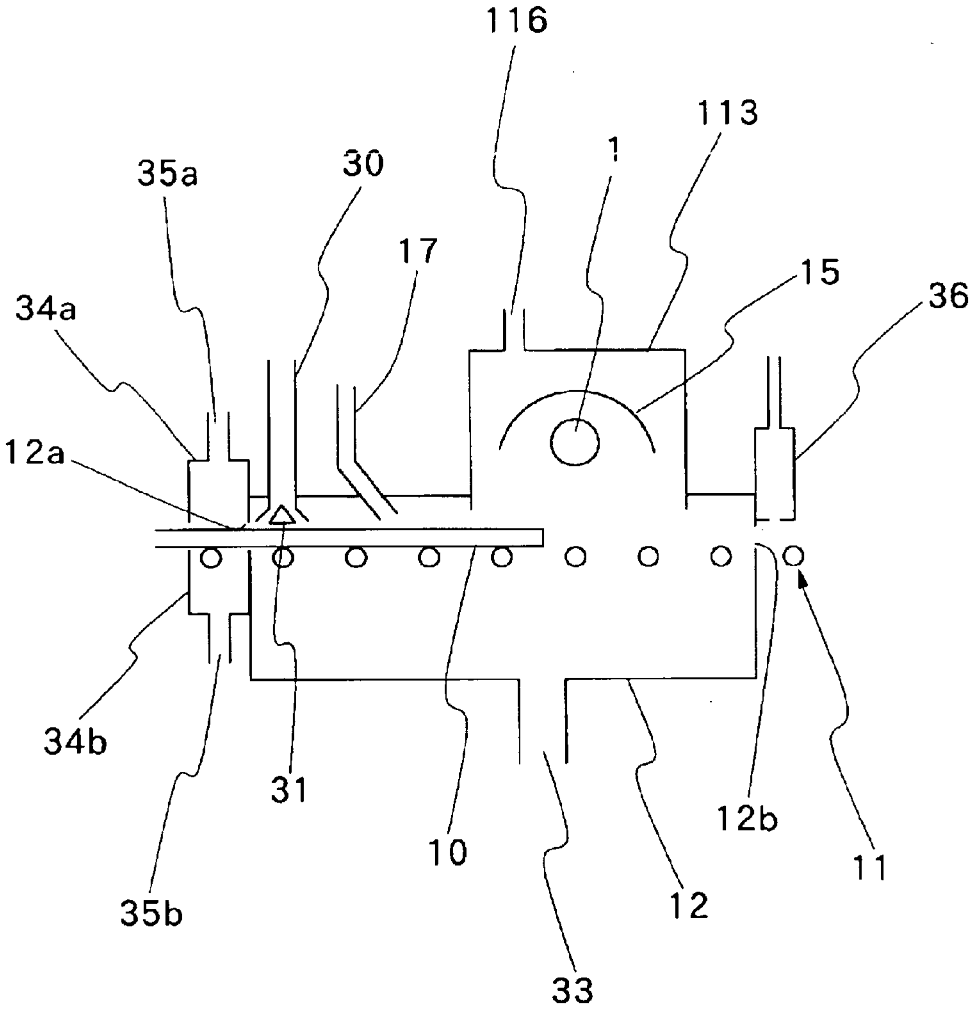
FIG. 6 is a schematic view of a substrate treating apparatus adopted as a second embodiment of the present invention.

As described above, a substantially oxygen-free atmosphere is maintained in the internal space of the treating chamber 12. Therefore, if desired, the window pane of the lamp house may be removed to provide an open lamp house 113 as in the case of a modification shown in FIG. 6. The window pane of glass needs to be replaced at a certain frequency because it is deteriorated in the long run by repeated transmissions of ultraviolet ray. Namely, the lamp house without a window pane can contribute to make the maintenance and service easily by lowering the frequency of parts replacements. In the case of the hermetically closed lamp house, there is no need for constantly feeding nitrogen gas thereto through the nitrogen gas feed pipe. However, in the case of the open lamp house 113 which is opened to the treating chamber on its bottom side as shown in FIG. 6, it is necessary to supply dry nitrogen gas constantly to the treating chamber through a nitrogen gas feed pipe 116 thereby to prevent wet nitrogen gas, which is supplied through the wet nitrogen gas feed nozzle 17, from entering the lamp house 113.

Figure 7:
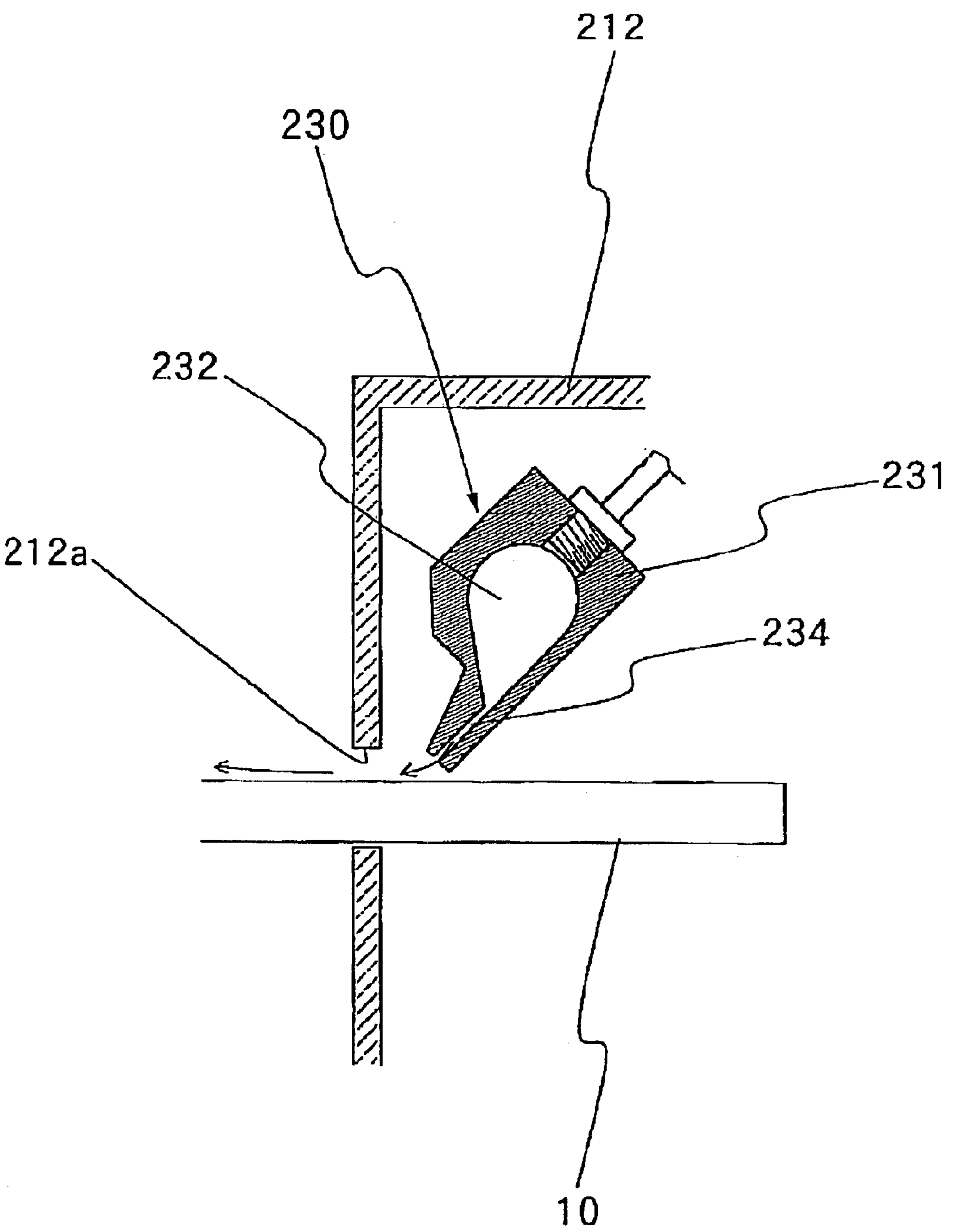
FIG. 7 is a fragmentary sectional view of a substrate treating apparatus adopted as a third embodiment of the invention.
Figure 8:
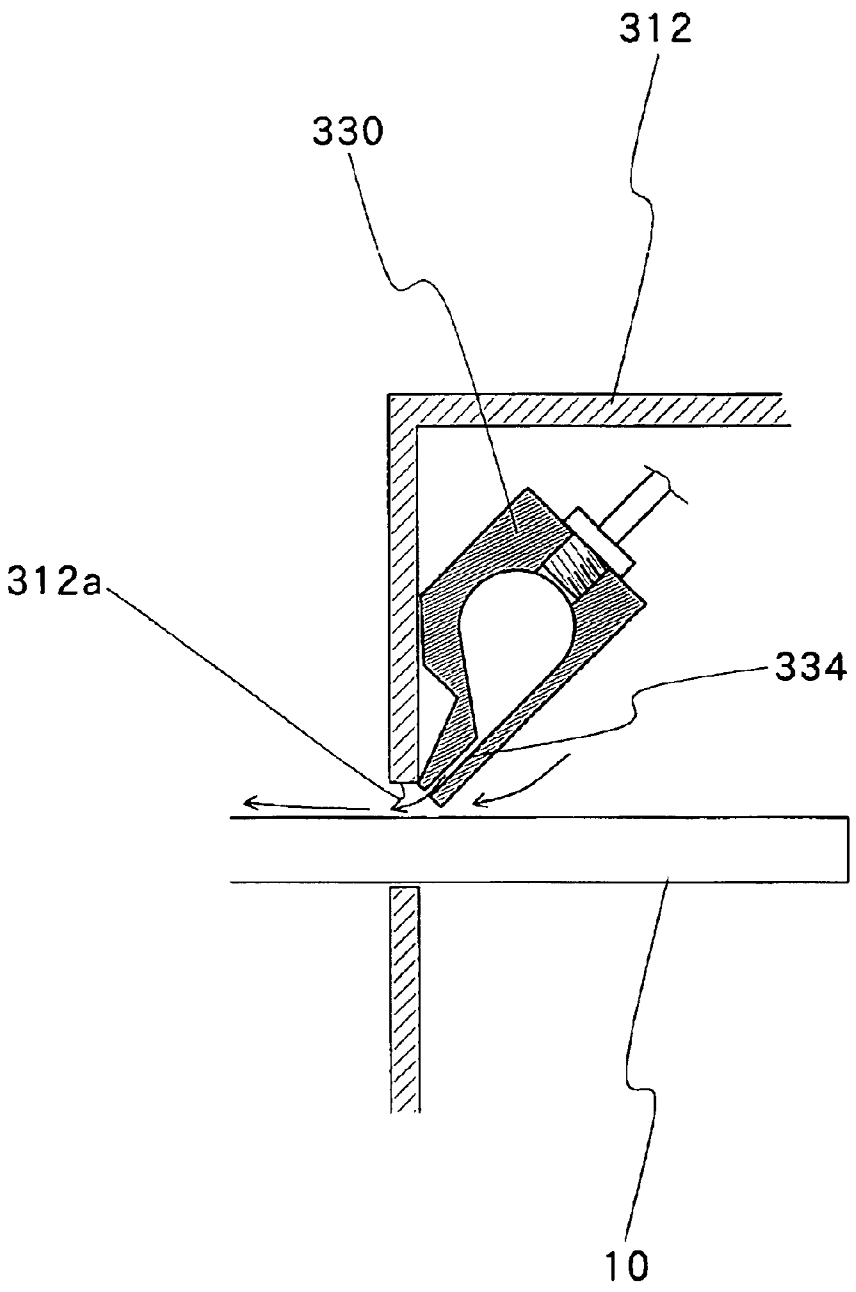
FIG. 8 is a fragmentary sectional view of a substrate treating apparatus adopted as a fourth embodiment of the present invention.

Shown in FIGS. 7 and 8 are alternative examples of the oxygen removing means which can be suitably employed in the present invention. In this regard, depending upon the type of the substrate transfer mechanism, oxygen can be removed from the surface of a substrate plate by bringing a sweeper plate or roller into contact therewith.

Shown in FIG. 7 is a purging gas injection nozzle 230 which is provided within a treating chamber 212 in the vicinity of and at least on the upper side of an entrance opening 212*a*. If desired, a similar purging gas injection nozzle 230 may be provided also on the lower side of the entrance opening 212*a*.

In this instance, the sweeping gas injection nozzle 230 is provided with a tubular nozzle body 231 of a length which is sufficient for covering the entire width of a substrate plate 10. Formed internally of the nozzle body 231 is a pressure chamber 232 to which an inert gas feed pipe is connected. Further, the nozzle body 231 is provided with a slit mouth 234 at and along one side thereof to spurt an inert gas toward a substrate plate 10 on the roller conveyer 11, for example, at an angle of incidence of approximately 30 to 40 degrees with respect to the treating surface of the substrate 10.

With the arrangements as described above, by an inert gas (e.g., nitrogen gas) which is spurted out under high pressure from the gas injection nozzle 230, air which may exists on or in the vicinity of a treating surface of the substrate plate 10 is blasted away to remove oxygen from the treating atmosphere as indicated by an arrow in FIG. 7. A major part of the inert gas which is injected by the gas injection nozzle 230 is discharged from the treating chamber 212. In this case, it is preferable to connect another inert gas feed pipe (not shown) to the treating chamber 212 and to supply thereto an inert gas for preventing pressure drops in the treating chamber 212, that is, for maintaining the treating chamber 212 at a higher pressure level than the ambient atmosphere.

Further, shown in FIG. 8 is a gas injection nozzle 330 which is similar to the above-described gas injection nozzle 230 in construction. In this case, the gas injection nozzle 330 is located in the treating chamber such that its slit mouth 334 is directed toward a gap space between a substrate plate and an entrance opening 312*a* of a treating chamber 312. The sweeping gas which is injected by the gas injection nozzle 330 is entirely discharged from the treating chamber, so that it is not necessarily required to be an inert gas. For example, in this case even air can be used as a sweeping gas. Besides, due to a negative pressure which is developed at the entrance opening 12*a* as a result of injection of the purging gas, the inert gas filling the treating chamber 312 is pulled toward and carried away together with sweeping air streams leaving the treating chamber 312. Therefore, an oxygen-containing air layer on the surface of the substrate plate 10 is swept away and replaced by an inert gas which prevails in the treating chamber 312.

In the same manner as explained in the foregoing embodiments, the contact angle of the substrate surface becomes smaller after removal of organic contaminants by the above dry washing treatment. Subsequent to the dry washing treatment, the substrate plate 10 is passed through a number of stages for further treatments, for example, in an LCD panel fabrication process as diagrammatically shown in FIG. 9.

Figure 9:
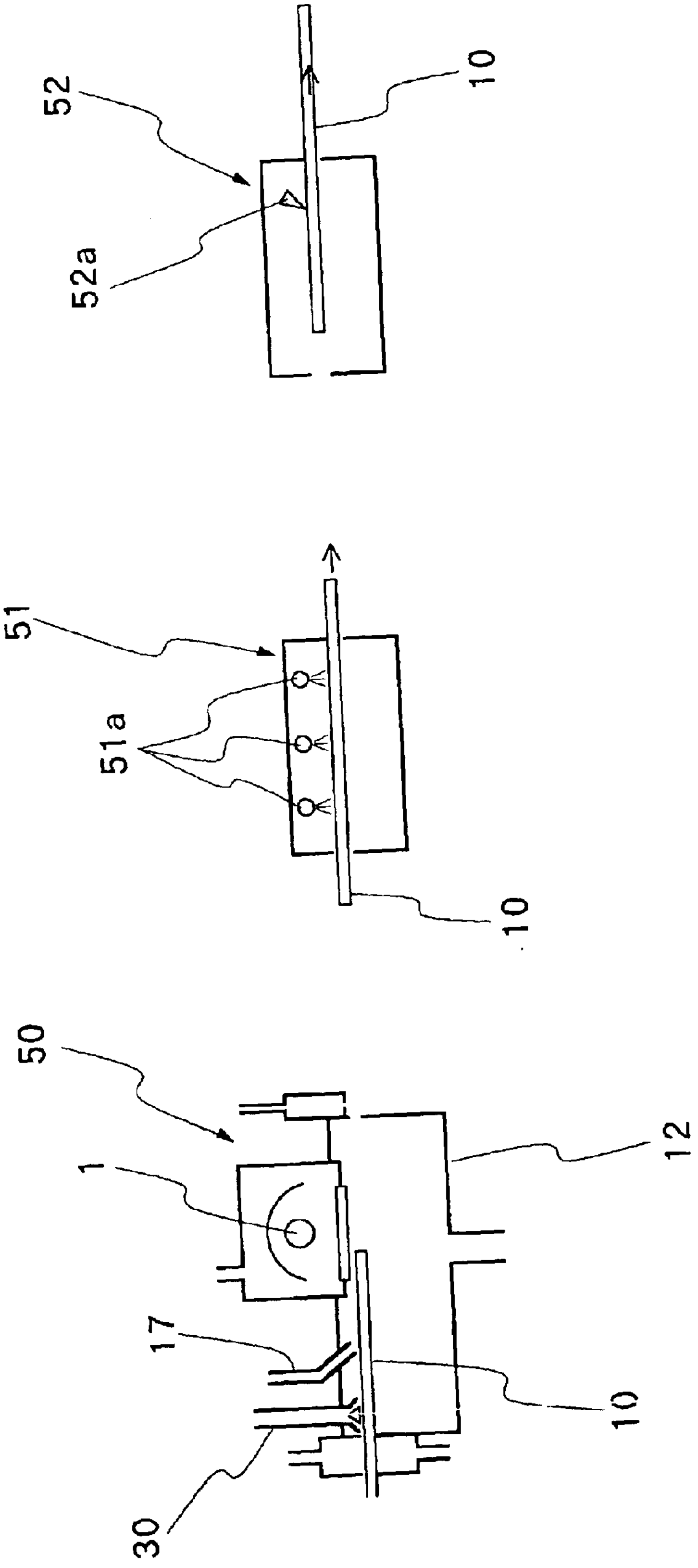
FIG. 9 is a schematic view of a substrate washing and drying line including a dry washing stage.

Indicated at 50 in FIG. 9 is the above-described dry washing stage, and at 51 is a wet washing stage following the dry washing treatment. The wet washing stage 51 is followed by a drying stage 52. By these treatments, surfaces of the substrate plate 10 are cleaned completely.

In the wet washing stage 51, inorganic contaminants on the surfaces of the substrate plate 10 are washed away in a shower of ultrasonically activated pure water which is poured through shower heads 51*a*. Needless to say, this wet washing stage may employ a different type of washing in place of the shower type, for example, may employ a scrubbing type of washing by the use of scrubbing brushes or a dip-in type of washing by immersion in an ultrasound washing bath, or may employ a combination of different types of washing. Inorganic as well as organic contaminants are removed virtually completely in this wet washing stage until surfaces of the substrate plate 10 are put in an extremely clean state. In the following drying stage 52, the washed substrate plate can be dried by spin drying, or by air knife effects, that is, by the use of an air knife nozzle 52*a* as shown by way of example in the drawing. By passage through these washing and drying stages, the substrate plate 10 is completely cleaned and dried.

Further, in some cases, the dry washing treatment may come after wet washing and drying treatments. For example, in the case of a pretreatment preceding to application of a developer solution or the like, a substrate plate 10 is wet-washed in the first place to remove contaminant substances from its surfaces, followed by drying and dry washing treatments. By the last dry washing treatment, the surface conditions of the substrate plate are improved to have a smaller contact angle, ensuring uniform application of a developer solution in a succeeding stage.

As clear from the foregoing description, according to the present invention, in a dry washing treatment of a substrate plate under irradiation of ultraviolet ray, accuracy and washing effects by irradiated ultraviolet ray are improved to a remarkable degree by maintaining an oxygen-free atmosphere is maintained in an irradiating region withing a treating chamber.

What is claimed is:

1. A method for treating a surface of a substrate plate in an isolated environment under irradiation of ultraviolet ray emitted from a dielectric barrier discharge lamp while said substrate plate is being transferred by a transfer means, said method comprising:

removing oxygen on and in the vicinity of a treating surface of said substrate plate in the isolated environment by blasting an inert gas on said treating surface of said substrate plate at an oblique angle toward an upstream side in a substrate transfer direction;

humidifying said treating surface and surrounding atmosphere of said substrate plate in the isolated environment by supplying a humidified inert gas to said substrate plate obliquely toward a downstream side in said substrate transfer direction; and irradiating said treating surface of said substrate plate in the isolated environment with ultraviolet ray from said dielectric barrier discharge lamp.

2. A method for treating a surface of a substrate plate as defined in claim 1, wherein oxygen is removed from said treating surface of said substrate plate by blasting thereto an inert gas or a humidified inert gas.

3. A method for treating a surface of a substrate plate as defined in claim 1, wherein said inert gas is nitrogen gas.

4. The method of claim 1, wherein the isolated environment is in a chamber.

5. A method for treating a surface of a substrate plate while being transferred horizontally across a treating chamber, having an isolated environment, under irradiation of ultraviolet ray emitted from a dielectric barrier discharge lamp, said method comprising:

removing oxygen or air on and in the vicinity of a treating surface of said substrate plate, in the isolated environment, by blasting an inert gas on said treating surface at an oblique angle toward a upstream side in a substrate transfer direction;

humidifying said treating surface and surrounding atmosphere of said substrate plate, in the isolated environment, by supplying a water vapor-containing humidified inert gas to said substrate obliquely toward a downstream side in said substrate transfer direction; and irradiating said treating surface of said substrate plate, in the isolated environment, with ultraviolet ray from said dielectric barrier discharge lamp thereby cracking water vapor into a reductive active member [H.] and an oxidative active member [.OH] for reaction with contaminant substances on said treating surface.

* * * * *